US012640183B2

(12) United States Patent
Choi et al.

(10) Patent No.: US 12,640,183 B2
(45) Date of Patent: May 26, 2026

(54) APPARATUSES AND METHODS REFRESH RATE REGISTER ADJUSTMENT BASED ON REFRESH QUEUE

(71) Applicant: MICRON TECHNOLOGY, INC., Boise, ID (US)

(72) Inventors: Wonjun Choi, Boise, ID (US); Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 18/747,740

(22) Filed: Jun. 19, 2024

(65) Prior Publication Data

US 2025/0111872 A1     Apr. 3, 2025

Related U.S. Application Data

(60) Provisional application No. 63/587,520, filed on Oct. 3, 2023.

(51) Int. Cl.
G11C 11/406     (2006.01)
(52) U.S. Cl.
CPC .............................. G11C 11/40626 (2013.01)
(58) Field of Classification Search
CPC ................................................ G11C 11/40626
USPC ......................................................... 365/222
See application file for complete search history.

(56) References Cited

U.S. PATENT DOCUMENTS

| | | |
|---|---|---|
| 5,225,839 A | 7/1993 | Okurowski et al. |
| 5,299,159 A | 3/1994 | Balistreri et al. |
| 5,654,929 A | 8/1997 | Mote |
| 5,699,297 A | 12/1997 | Yamazaki et al. |
| 5,867,442 A | 2/1999 | Kim et al. |
| 5,933,377 A | 8/1999 | Hidaka |
| 5,943,283 A | 8/1999 | Wong et al. |
| 5,956,288 A | 9/1999 | Bermingham et al. |

(Continued)

FOREIGN PATENT DOCUMENTS

| | | |
|---|---|---|
| BE | 825677 A | 8/1975 |
| CN | 1841551 A | 10/2006 |

(Continued)

OTHER PUBLICATIONS

Anonymous: "Frequency—Wikipedia", Dec. 17, 2018, retrieved from URL: https://en.wikipedia.org/w/index.php?title=Frequency &oldid=874192848; pp. all.

(Continued)

*Primary Examiner* — Anthan Tran

(74) *Attorney, Agent, or Firm* — Dorsey & Whitney LLP

(57)     ABSTRACT

Apparatuses, systems, and methods for refresh rate register adjustment based on a targeted refresh queue. A memory includes a temperature sensor which measures a temperature of the memory. The memory also includes a targeted refresh queue which stores identified aggressor addresses. A value of a refresh rate register is set based on both the measured temperature and the number of addresses in the queue. A controller of the memory reads the value of the refresh rate register and provides a refresh signal with timing based on the refresh rate register. In some embodiments, a ratio of targeted and normal refresh operations is adjusted based on how many addresses are in the targeted refresh queue.

20 Claims, 7 Drawing Sheets

(56)             References Cited

U.S. PATENT DOCUMENTS

| | | | |
|---|---|---|---|
| 5,959,923 A | 9/1999 | Matteson et al. |
| 5,970,507 A | 10/1999 | Kato et al. |
| 5,999,471 A | 12/1999 | Choi |
| 5,999,473 A | 12/1999 | Harrington et al. |
| 6,002,629 A | 12/1999 | Kim et al. |
| 6,011,734 A | 1/2000 | Pappert |
| 6,061,290 A | 5/2000 | Shirley |
| 6,064,621 A | 5/2000 | Tanizaki et al. |
| 6,212,118 B1 | 4/2001 | Fujita |
| 6,298,413 B1 | 10/2001 | Christenson |
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,490,216 B1 | 12/2002 | Chen et al. |
| 6,515,928 B2 | 2/2003 | Sato et al. |
| 6,535,950 B1 | 3/2003 | Funyu et al. |
| 6,535,980 B1 | 3/2003 | Kumar et al. |
| 6,563,757 B2 | 5/2003 | Agata |
| 6,567,340 B1 | 5/2003 | Nataraj et al. |
| 6,950,364 B2 | 9/2005 | Kim |
| 6,977,824 B1 | 12/2005 | Yang et al. |
| 7,002,868 B2 | 2/2006 | Takahashi |
| 7,057,960 B1 | 6/2006 | Fiscus et al. |
| 7,061,225 B2 | 6/2006 | Yang et al. |
| 7,061,780 B2 | 6/2006 | Yang et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,526,260 B2 | 9/2013 | Pyeon |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,076,548 B1 | 7/2015 | Park et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narul et al. |
| 9,418,723 B2 | 8/2016 | Chishti et al. |
| 9,424,907 B2 | 8/2016 | Fujishiro |
| 9,478,316 B1 | 10/2016 | Ryu |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,640,242 B1 | 5/2017 | Lo et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,421 B1 | 8/2017 | Hedden |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,892,779 B2 | 2/2018 | Kang et al. |
| 9,922,694 B2 | 3/2018 | Akamatsu |
| 9,928,896 B1 | 3/2018 | Kim et al. |
| 9,934,143 B2 | 4/2018 | Bains et al. |
| 9,953,696 B2 | 4/2018 | Kim |
| 9,972,377 B2 | 5/2018 | Oh et al. |
| 9,978,430 B2 | 5/2018 | Seo et al. |
| 10,003,328 B1 | 6/2018 | Yin et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,418,978 B1 | 9/2019 | Au Yeung et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,672,449 B2 | 6/2020 | Ito et al. |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,062,754 B2 | 7/2021 | Ito et al. |
| 11,069,393 B2 | 7/2021 | Cowles et al. |
| 11,081,160 B2 | 8/2021 | Ito et al. |
| 11,222,683 B2 | 1/2022 | Rehmeyer |

(56)                References Cited

U.S. PATENT DOCUMENTS

| | | |
|---|---|---|
| 11,222,686 B1 | 1/2022 | Noguchi |
| 11,227,649 B2 | 1/2022 | Meier et al. |
| 11,264,079 B1 | 3/2022 | Roberts |
| 11,302,374 B2 | 4/2022 | Jenkinson et al. |
| 11,302,377 B2 | 4/2022 | Li et al. |
| 11,309,010 B2 | 4/2022 | Ayyapureddi |
| 11,309,012 B2 | 4/2022 | Meier et al. |
| 11,315,619 B2 | 4/2022 | Wolff |
| 11,315,620 B2 | 4/2022 | Ishikawa et al. |
| 11,320,377 B2 | 5/2022 | Chen et al. |
| 11,348,631 B2 | 5/2022 | Wu et al. |
| 11,380,382 B2 | 7/2022 | Zhang et al. |
| 11,386,946 B2 | 7/2022 | Ayyapureddi et al. |
| 11,417,383 B2 | 8/2022 | Jenkinson et al. |
| 11,532,346 B2 | 12/2022 | Brown et al. |
| 11,557,331 B2 | 1/2023 | Mitsubori et al. |
| 11,610,622 B2 | 3/2023 | Rehmeyer et al. |
| 11,615,831 B2 | 3/2023 | Yamamoto |
| 11,626,152 B2 | 4/2023 | Wu et al. |
| 11,688,452 B2 | 6/2023 | Nale et al. |
| 11,715,512 B2 | 8/2023 | Li et al. |
| 11,749,331 B2 | 9/2023 | Wu et al. |
| 11,798,610 B2 | 10/2023 | Cowles et al. |
| 11,810,612 B2 | 11/2023 | Roberts |
| 11,935,576 B2 | 3/2024 | Ishikawa et al. |
| 11,955,158 B2 | 4/2024 | Brown et al. |
| 12,002,501 B2 | 6/2024 | Noguchi |
| 12,112,787 B2 | 10/2024 | He et al. |
| 12,125,514 B2 | 10/2024 | Suzuki |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0160838 A1 | 8/2004 | Pelley et al. |
| 2004/0184323 A1 | 9/2004 | Mori et al. |
| 2004/0218431 A1 | 11/2004 | Chung et al. |
| 2005/0002254 A1 | 1/2005 | Otsuka et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0249009 A1 | 11/2005 | Shieh |
| 2005/0265104 A1 | 12/2005 | Remaklus et al. |
| 2006/0018174 A1 | 1/2006 | Park et al. |
| 2006/0050591 A1 | 3/2006 | Park |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0198220 A1 | 9/2006 | Yoon et al. |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033338 A1 | 2/2007 | Tsern |
| 2007/0033339 A1 | 2/2007 | Best et al. |
| 2007/0058462 A1 | 3/2007 | Blodgett |
| 2007/0106838 A1 | 5/2007 | Choi |
| 2007/0147154 A1 | 6/2007 | Lee |
| 2007/0165042 A1 | 7/2007 | Yagi |
| 2007/0171750 A1 | 7/2007 | Oh |
| 2007/0237016 A1 | 10/2007 | Miyamoto et al. |
| 2007/0263442 A1 | 11/2007 | Cornwell et al. |
| 2007/0268768 A1 | 11/2007 | Kawakubo |
| 2007/0297252 A1 | 12/2007 | Singh |
| 2008/0028137 A1 | 1/2008 | Schakel et al. |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0147606 A1 | 6/2009 | Daniel |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fuklage |
| 2010/0329069 A1 | 12/2010 | Ito et al. |
| 2011/0007592 A1 | 1/2011 | Tashiro |
| 2011/0026290 A1 | 2/2011 | Noda et al. |
| 2011/0055495 A1 | 3/2011 | Remaklus et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0170353 A1 | 7/2011 | Nguyen |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |

(56)  References Cited

U.S. PATENT DOCUMENTS

| | | |
|---|---|---|
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0153315 A1 | 6/2014 | Kwon et al. |
| 2014/0156923 A1 | 6/2014 | Bains et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0036445 A1 | 2/2015 | Yoshida et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0170733 A1 | 6/2015 | Lee et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0085466 A1 | 3/2016 | Benedict et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0224262 A1 | 8/2016 | Mandava et al. |
| 2016/0225433 A1 | 8/2016 | Bains et al. |
| 2016/0239663 A1 | 8/2016 | Healy et al. |
| 2016/0336060 A1 | 11/2016 | Shin |
| 2016/0343423 A1 | 11/2016 | Shido |
| 2016/0352518 A1 | 12/2016 | Ford et al. |
| 2017/0011792 A1 | 1/2017 | Oh et al. |
| 2017/0047110 A1 | 2/2017 | Kang et al. |
| 2017/0052722 A1 | 2/2017 | Ware et al. |
| 2017/0062038 A1 | 3/2017 | Doo et al. |
| 2017/0076779 A1 | 3/2017 | Bains et al. |
| 2017/0092350 A1 | 3/2017 | Halbert et al. |
| 2017/0110177 A1 | 4/2017 | Lee et al. |
| 2017/0111792 A1 | 4/2017 | Correia Fernandes et al. |
| 2017/0117030 A1 | 4/2017 | Fisch et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0177505 A1 | 6/2017 | Basak et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0264428 A1 | 9/2017 | Seger |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082736 A1 | 3/2018 | Jung |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |

(56) References Cited

U.S. PATENT DOCUMENTS

| | | |
|---|---|---|
| 2018/0341553 A1 | 11/2018 | Koudele et al. |
| 2018/0342282 A1 | 11/2018 | Morgan |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0051347 A1 | 2/2019 | Lee |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122722 A1 | 4/2019 | Yamada et al. |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0139599 A1 | 5/2019 | Ito et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0237131 A1 | 8/2019 | Ito |
| 2019/0237132 A1 | 8/2019 | Morohashi |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0371390 A1 | 12/2019 | Ito |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194050 A1 | 6/2020 | Akamatsu |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2020/0402568 A1* | 12/2020 | He .................... G11C 11/40626 |
| 2021/0057021 A1 | 2/2021 | Wu et al. |
| 2021/0057022 A1 | 2/2021 | Jenkinson et al. |
| 2021/0109577 A1 | 4/2021 | Mandava et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0223852 A1* | 7/2021 | Chang ..................... G06F 7/575 |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2021/0350844 A1 | 11/2021 | Morohashi et al. |
| 2021/0406170 A1 | 12/2021 | Jung et al. |
| 2022/0051716 A1 | 2/2022 | Ayyapureddi |
| 2022/0059153 A1 | 2/2022 | Zhang et al. |
| 2022/0059158 A1 | 2/2022 | Wu et al. |
| 2022/0068361 A1 | 3/2022 | Du et al. |
| 2022/0091784 A1 | 3/2022 | Brand |
| 2022/0093165 A1 | 3/2022 | Mitsubori et al. |
| 2022/0165328 A1 | 5/2022 | Ishikawa et al. |
| 2022/0189537 A1 | 6/2022 | Kim |
| 2022/0189539 A1 | 6/2022 | Li et al. |
| 2022/0199144 A1 | 6/2022 | Roberts |
| 2022/0199150 A1* | 6/2022 | Song ................. G11C 11/40615 |
| 2022/0270670 A1 | 8/2022 | Wu et al. |
| 2022/0270672 A1 | 8/2022 | Kim et al. |
| 2023/0105151 A1 | 4/2023 | Brown et al. |
| 2023/0168818 A1 | 6/2023 | You et al. |
| 2023/0298654 A1 | 9/2023 | Du et al. |
| 2023/0352075 A1 | 11/2023 | Suzuki |
| 2023/0352076 A1 | 11/2023 | He et al. |
| 2024/0038288 A1 | 2/2024 | Kim et al. |
| 2024/0062798 A1 | 2/2024 | Cowles et al. |
| 2024/0071460 A1 | 2/2024 | Noguchi |
| 2024/0339146 A1 | 10/2024 | Kim |
| 2025/0006243 A1 | 1/2025 | He et al. |
| 2025/0111045 A1 | 4/2025 | Lee et al. |
| 2025/0173255 A1 | 5/2025 | Rooney |

FOREIGN PATENT DOCUMENTS

| | | |
|---|---|---|
| CN | 1879173 A | 12/2006 |
| CN | 101026003 A | 8/2007 |
| CN | 101038785 A | 9/2007 |
| CN | 101047025 A | 10/2007 |
| CN | 101067972 A | 11/2007 |
| CN | 101075477 A | 11/2007 |
| CN | 101091221 A | 12/2007 |
| CN | 101211653 A | 7/2008 |
| CN | 101217060 A | 7/2008 |
| CN | 101243450 A | 8/2008 |
| CN | 102301423 A | 12/2011 |
| CN | 102663155 A | 9/2012 |
| CN | 102737706 A | 10/2012 |
| CN | 102931187 A | 2/2013 |
| CN | 104350546 A | 2/2015 |
| CN | 104733035 A | 6/2015 |
| CN | 104737234 A | 6/2015 |
| CN | 104781885 A | 7/2015 |
| CN | 104981874 A | 10/2015 |
| CN | 105378847 A | 3/2016 |
| CN | 105529047 A | 4/2016 |
| CN | 106158005 A | 11/2016 |
| CN | 106710621 A | 5/2017 |
| CN | 106816169 A | 6/2017 |
| CN | 107017016 A | 8/2017 |
| CN | 107025927 A | 8/2017 |
| CN | 107301874 A | 10/2017 |
| CN | 107871516 A | 4/2018 |
| CN | 107919150 A | 4/2018 |
| CN | 108154895 A | 6/2018 |
| CN | 108242248 A | 7/2018 |
| CN | 108806740 A | 11/2018 |
| CN | 109727624 A | 5/2019 |
| CN | 109949844 A | 6/2019 |
| CN | 110032897 A | 7/2019 |

(56) References Cited

FOREIGN PATENT DOCUMENTS

| | | | |
|---|---|---|---|
| CN | 110520929 | A | 11/2019 |
| CN | 110678925 | A | 1/2020 |
| CN | 110827884 | A | 2/2020 |
| CN | 111052243 | A | 4/2020 |
| CN | 111247586 | A | 6/2020 |
| CN | 111354393 | A | 6/2020 |
| CN | 114121076 | A | 3/2022 |
| JP | S6282887 | A | 4/1987 |
| JP | 2003085054 | A | 3/2003 |
| JP | 2005-216429 | A | 8/2005 |
| JP | 2011-258259 | A | 12/2011 |
| JP | 4911510 | B2 | 1/2012 |
| JP | 2013-004158 | A | 1/2013 |
| JP | 2014238903 | A | 12/2014 |
| JP | 6281030 | B1 | 1/2018 |
| KR | 20030063947 | A | 7/2003 |
| KR | 20070109104 | A | 11/2007 |
| KR | 20160134411 | A | 11/2016 |
| KR | 20170053373 | A | 5/2017 |
| KR | 20170093053 | A | 8/2017 |
| KR | 20180011642 | A | 2/2018 |
| KR | 20180081989 | A | 7/2018 |
| KR | 20180101647 | A | 9/2018 |
| KR | 20190046572 | A | 5/2019 |
| TW | 201801079 | A | 1/2018 |
| WO | 2014120477 | | 8/2014 |
| WO | 2015030991 | A1 | 3/2015 |
| WO | 2017171927 | A1 | 10/2017 |
| WO | 2019079157 | A1 | 4/2019 |
| WO | 2019083884 | A1 | 5/2019 |
| WO | 2019222960 | A1 | 11/2019 |
| WO | 2020010010 | A1 | 1/2020 |
| WO | 2020117686 | A1 | 6/2020 |
| WO | 2020247163 | A1 | 12/2020 |
| WO | 2020247639 | A1 | 12/2020 |

OTHER PUBLICATIONS

Kyungbae Park et al. "Experiments and Root Cause Anaylsis for Active-Precharge Hammering Fault in DDR3 SDRAM Under 3 X NM Technology"; Microelectronics Reliability: An Internet Journal and World Abstracting Service; vol. 57; Dec. 23, 2015; pp. 39-46.

Kim, et al. "Flipping Bits in MemoryWithout Accessing Them: An Experimental Study of DRAM Disturbance Errors", IEEE, Jun. 2014; pp. all.

U.S. Appl. No. 18/746,551 titled "Apparatuses and Methods for Direct Refresh Management Attack Identification" filed Jun. 18, 2024, pp. all pages of the application as filed.

U.S. Appl. No. 18/774,730 titled "Apparatuses and Methods for Controller Signaling of Refresh Operations" filed Jul. 16, 2024, pp. all pages of the application as filed.

* cited by examiner

| Function | Register Type | Data |
|---|---|---|
| Refresh Multiplier (RM) | Read-only | 00000в: SDRAM Low Temperature Operating Limit Exceeded<br>00001в: 8x<br>00010в: 6x<br>00011в: 4x<br>00100в: 3.3x<br>00101в: 2.5x<br>00110в: 2.0x<br>00111в: 1.7x<br>01000в: 1.3x<br>01001в: 1x<br>01010в: 0.7x<br>01011в: 0.5x<br>01100в: 0.25x, no de-rating<br>01101в: 0.25x, with de-rating<br>01110в: 0.125x, no de-rating<br>01111в: 0.125x, with de-rating<br>11111в: SDRAM High Temperature Operating Limit Exceeded<br>All Other are Reserved. |

710
Measuring a Temperature of a
Memory Device

720
Determining a Number of Addresses
Stored in a Targeted Refresh Queue

730
Setting a Value of a Refresh Rate Register based on the Measured Temperature
and the Number of Addresses

APPARATUSES AND METHODS REFRESH RATE REGISTER ADJUSTMENT BASED ON REFRESH QUEUE

CROSS REFERENCE TO RELATED APPLICATION(S)

This application claims the benefit under 35 U.S.C. § 119 of the earlier filing date of U.S. Provisional Application Ser. No. 63/587,520 filed Oct. 3, 2023 the entire contents of which is hereby incorporated by reference in its entirety for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

Certain access patterns of the memory may cause increased rate of data degradation of memory cells in other nearby memory cells. To prevent information from being lost, it may be important to locate these memory cells so they can be refreshed.

BRIEF DESCRIPTION OF THE DRAWINGS

FIG. 6 is a table of a values in a refresh rate register according to some embodiments of the present disclosure.

DETAILED DESCRIPTION

Figure 1:
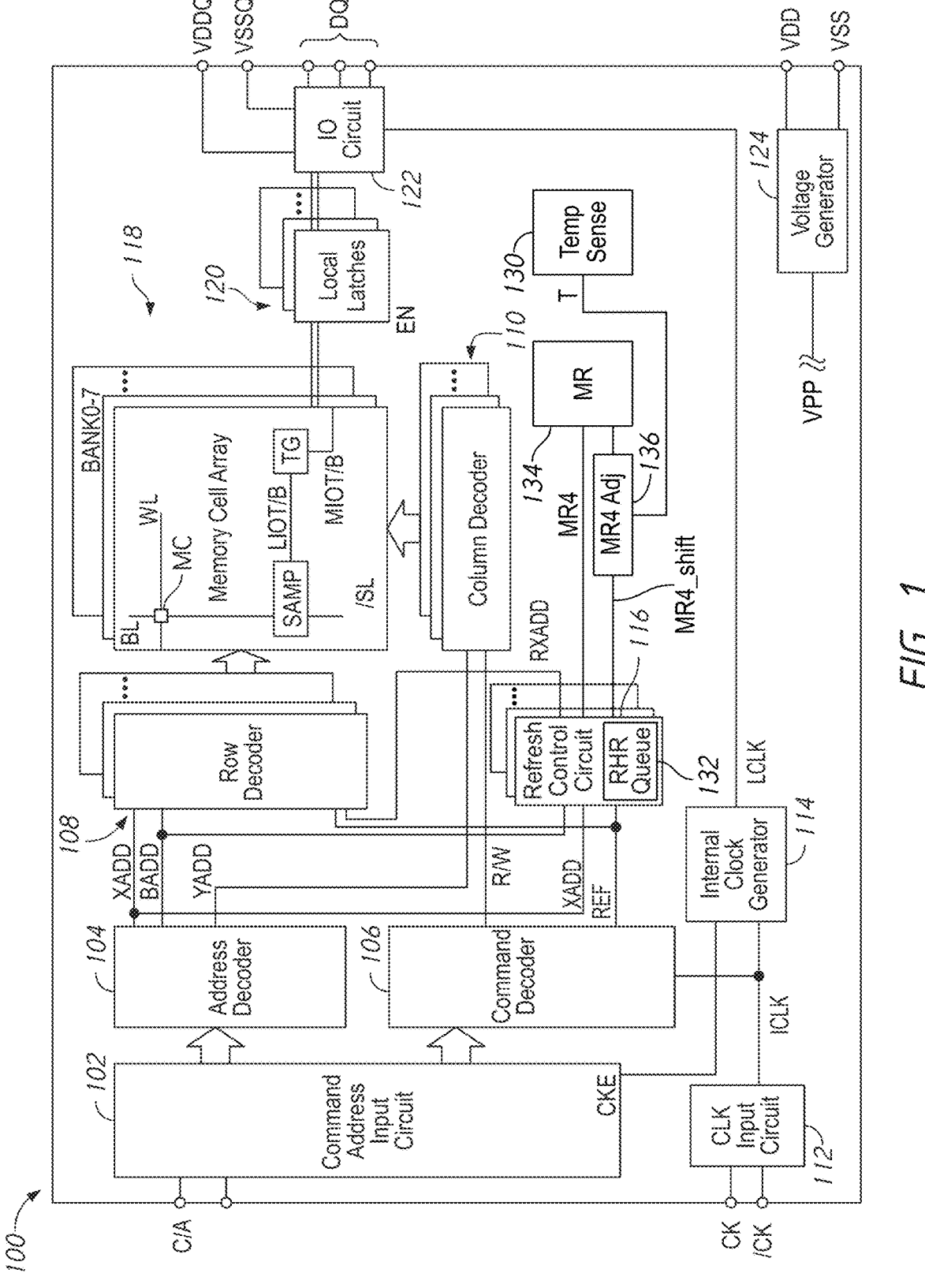
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. The memory may perform a refresh cycle by performing refresh operations on the wordlines of the memory in a sequence such that over time the wordlines of the memory are refreshed at a rate faster than the expected rate of data degradation. The expected rate of data degradation may be based, in part, on a temperature of the memory. A temperature sensor of the memory may update a refresh register which indicates a refresh rate, and the rate at which refresh operations are performed is based on the refresh register. For example, a controller of the memory may read the refresh register and then provide a refresh signal with timing based on the value of the refresh register.

Certain access patterns to a word line of the memory (an aggressor row or aggressor word line) may cause an increased rate of data degradation in the memory cells along nearby word lines (victim rows or victim word lines). Since the information in those memory cells may degrade at a rate faster than the refresh rate, aggressors may be identified so that their victims can be refreshed as part of targeted refresh operations. Identified aggressors may be stored in an aggressor queue.

The aggressor queue may have a finite amount of space, and so if aggressors are being detected faster than targeted refresh operations are clearing them from the queue, the memory may run into situations where the queue becomes full. When the queue becomes full, the memory may issue an alert calling for increased targeted refresh operations, which will empty the queue, but at the cost of taking up time that could have been used for other memory operations. It may be desirable to prevent situations where the queue becomes full.

The present disclosure is drawn to apparatuses, systems, and methods for refresh rate register adjustment based on the refresh queue. A refresh rate register of the memory has a value based on a temperature of the memory and how full the refresh queue is. As the refresh queue becomes more full, the value of the refresh rate register is shifted from the level it would be at based on the temperature alone, to a level where a faster refresh rate is called for. In this manner, the rate of refresh operations may increase as the queue becomes more full, which in turn may help prevent the queue from reaching capacity.

In an example implementation, a memory device includes a mode register which includes a refresh rate register. A temperature sensor provides a temperature code based on a measure of the devices temperature. A refresh control circuit provides a refresh mode register shift signal with a value based on how many addresses are stored in the targeted refresh queue. A refresh register adjustment circuit sets the value of the refresh register in the mode register based on the temperature code and the refresh register shift signal. For example, the refresh register may have a set number of values. An initial value is picked based on the temperature code, and then the value is shifted a number of steps away from that initial value based on the refresh register shift signal.

In some embodiments, the register shift signal may also be used to set a ratio of normal (or sequential) refresh operations and targeted refresh operations. For example, if the register shift signal indicates a shift away from the initial (temperature based) value of the refresh register, then the ratio of targeted refresh operations may be increased. This may also help to increase targeted refresh operations as the refresh queue becomes more full.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. For example some memories may include 16 banks (e.g., BANK0 to BANK15), 4, banks, 32, banks, or other numbers of banks.

Each memory bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the memory cell at the intersection of an active word line and bit line BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC at the intersection of the active word line and the selected bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

In an example access operation which is a read operation, the device 100 may a read command along the C/A terminals. The memory 100 also receives a bank address, a row address and a column address along the C/A terminals as part of the read operation. Responsive to the read operation, data is read from memory cells in the memory array 118 in the bank specified by BADD at the intersection of the word line(s) associated with the row address and the bit line(s) associated with the column address. The row decoder 108 may activate a word line associated with XADD which causes data from the memory cells along that word line to be read out along the bit lines to the sense amplifiers. The column decoder 110 couples the bit lines associated with YADD to the LIOT/B lines and through them to the MIOT/B out to the read/write amplifier 120. The read data is output to outside from the data terminals DQ via the input/output circuit 122.

In an example access operation which is a write operation, the device 100 receives a write command as well as a row, column, and bank address along the C/A terminals, as well as data along the DQ terminals. Responsive to the write operation the data is written to the memory cells specified by the bank, row, and column address. The data is provided through the IO circuit 122 to the read/write amplifiers 120. The row decoder 108 activates word line(s) associated with XADD. The column decoder 110 couples the bit lines specified by YADD to the LIOT/B and through them to the MIOT/B to the read/write amplifier 120. The data from the read/write amplifier 120 is written to the coupled bit lines and through them to the memory cells at the intersection with the active word line.

The device 100 may also receive commands causing it to carry out one or more refresh operations as part of a refresh mode. In some embodiments, the refresh mode command may be externally issued to the memory device 100. For example, a controller of the memory 100 may issues a refresh signal REF, and responsive to each activation of the refresh signal REF, the memory 100 may perform one or more refresh operations. In some embodiments, the memory 100 may be placed in a self-refresh mode, and may generate the refresh signal REF with internal timing.

The refresh control circuit 116 performs refresh operations with timing based on the refresh signal REF. Each time the signal REF is activated, the refresh control circuit provides one or more refresh addresses RXADD. The refresh addresses are associated with one or more word lines of the memory array 118. Responsive to the refresh signal REF (and/or one or more internal refresh signals) the row decoder 108 may perform a refresh operation by refreshing the memory cells along the word line(s) associated with RXADD.

The refresh control circuit 116 may determine if each refresh operation is a normal (or sequential) refresh operation or a targeted refresh operation. In a sequential refresh operation, the refresh address is generated based on a sequence of addresses. For example, each refresh address may be based on a previous refresh address (e.g., RXADD (i)=RXADD (i−1)+1). The refresh control circuit 116 may identify addresses as aggressor addresses and store them in a targeted refresh queue 132.

When a targeted refresh operation is called for, the refresh address is generated based on an address from the queue 132. For example, the refresh address may represent word lines which are adjacent to the identified aggressor (e.g., RXADD=Aggressor +1 and Aggressor −1). Other relationships may also be used (e.g., +/−2, +/−3, +/−4, or others). When a targeted refresh operation is performed on the victims of an address in the queue 132, the address is removed from the queue 132 (or marked as used so that it can be overwritten). The refresh control circuit 116 provides a refresh rate register shift signal MR4_Shift based on how many addresses are stored in the refresh queue 132

In some embodiments, the refresh addresses generated for sequential refresh operations (which may be referred to as normal refresh addresses or sequential refresh addresses) may be associated with more word lines than the refresh address generated for targeted refresh operations (which may be referred to as targeted refresh addresses). For example, the sequential refresh addresses may be truncated compared to a full refresh address, and all word lines which share that truncated portion in common may be refreshed together. In contrast, a targeted refresh address may specify a single word line.

The memory device 100 includes a mode register 134, which stores various information about the memory. The mode register 134 includes a number of registers each of which stores one or more pieces of information, settings, etc. which may be used by the memory 100 and/or by a controller of the memory 100. For example, some registers may be read only, and the controller may perform a mode register read operation to retrieve that information. Some registers may have both read and write enabled, and a controller may perform a mode register write operation to change the value in the register. For example, this may be used if the controller wants to change a setting of the memory.

The mode register 134 includes a refresh rate register or a refresh multiplier register. In some embodiments, the refresh rate register may be the fourth register and may be abbreviated as MR4. For the sake of brevity the term MR4 may generally be used to refer to the refresh rate register. However, any register may be used as refresh rate register and the use of the term MR4 should not be interpreted as limiting the disclosure to embodiments where the fourth register is used. The refresh rate register MR4 stores a value (which may generally be read only from the controller's perspective) which indicates a rate at which refresh operations should be performed. For example, the memory may have a base or default refresh interval, which indicates a maximum amount of time which should pass between times the refresh signal REF is provided under default conditions. The value of MR4 may be a multiplier which is applied to that default refresh interval to give a value of the refresh interval for the purposes of determining the timing of REF during operations. For example, under conditions where slower refreshes are called for the value of MR4 may be greater (e.g., ×1.3, ×1.7, ×2.0, etc.) which may increase the time between activations of REF. Under conditions where more frequent refreshes are called for, the value of MR4 may be smaller (e.g., 0.7×, 0.5×, 0.25×, etc.) which may decrease the time between activations of REF.

The memory 100 includes a temperature sensor 130. The temperature sensor 130 measures a temperature of the memory 100 and provides a temperature code T based on that measurement. A refresh rate register adjustment circuit (or MR4 adjustment circuit) 136 sets of the value of the refresh rate register MR4 in the mode register 134 based on the temperature code T and the MR4 shift signal MR4_Shift. In an example implementation, the MR4 adjustment circuit 136 may select an initial value of MR4 based on the temperature code T. The MR4 shift signal may indicate a number of steps that the value of MR4 should be shifted 'down', or towards a smaller multiplier, to generate an adjusted MR4 value.

For example, if the MR4 register could have values 2.0×. 1.7×, 1.3×, 1×, 0.7×, 0.5×, and 0.25×, and the temperature calls for a value of 1.3×, but the signal MR4_Shift calls for 2 steps of adjustment, then the final value of MR4 would be 0.7×. Other values and other steps may be used in other example embodiments. The value of T may change as the temperature changes. For example, if the temperature increased, and the initial value would be 1×, the adjusted value would shift to 0.5×. Similarly, the value of MR4_Shift may change as state of the refresh queue 132 changes. For example, if enough targeted refresh operations occur that the refresh queue becomes empty, the value of MR4_Shift may call for fewer steps, and the adjusted MR4 value may move 'up' without the temperature changing.

In some embodiments, the value of MR4_Shift may also determine a ratio of targeted and normal refresh operations. For example, if MR4_Shift calls for no adjustment steps, a first ratio of targeted:normal refresh operations may be performed. If MR4_Shift calls for at least one step of adjustment, a second ratio of targeted:normal refreshes may be performed which is greater than the first ratio.

The power supply terminals are supplied with power supply potentials VDD and VSS. The power supply potentials VDD and VSS are supplied to an internal voltage generator circuit 124. The internal voltage generator circuit 124 generates various internal potentials VPP and other internal voltages based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
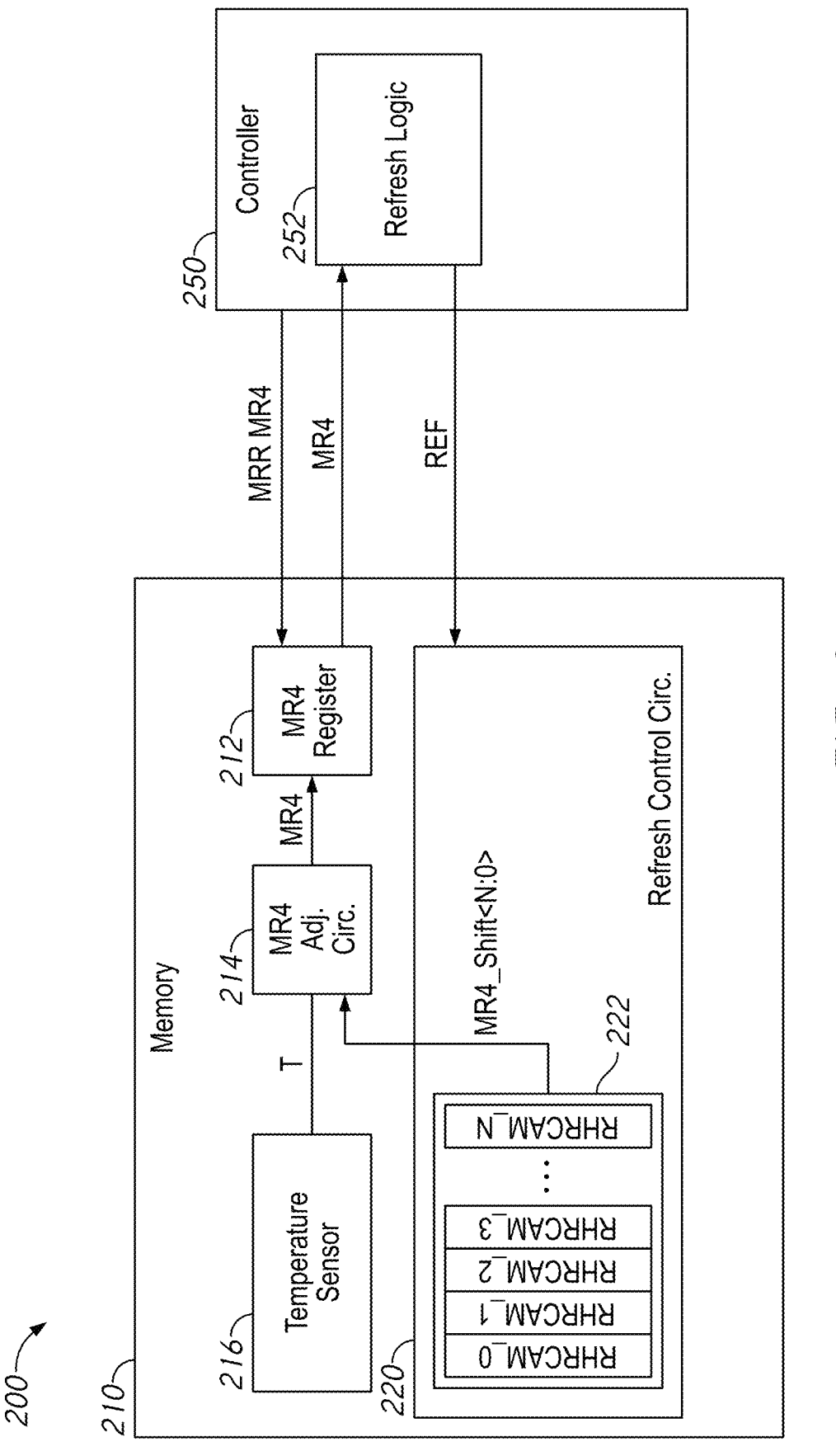
FIG. 2 is a block diagram of a memory system according to some embodiments of the present disclosure.

FIG. 2 is a block diagram of a memory system according to some embodiments of the present disclosure. The memory system 200 includes a memory device 210 and a controller 250 which operates the memory device. The memory device 210 may, in some embodiments, be implemented by the memory device 100 of FIG. 1. For the sake of brevity, certain components, signals, and operations already described with respect to FIG. 1 will not be shown or described again with respect to FIG. 2.

The memory device 210 includes a temperature sensor 216 (e.g., 130 of FIG. 1), an refresh rate register adjustment circuit 214 (e.g., 136 of FIG. 1) a refresh rate register (e.g., which may be part of a mode register such as 134 of FIG. 1), and a refresh control circuit 220 (e.g., 116 of FIG. 1). The controller 250 includes a refresh logic circuit 252 which provides the refresh signal REF with timing based on the value of the refresh rate register 212.

The temperature sensor 216 provides a temperature code T. The refresh control circuit 220 includes a targeted refresh queue 222 which provides a signal MR4_shift with a value based on how many addresses are stored in the queue 222. The MR4 adjustment circuit 214 sets an initial value of MR4 based on the temperature code T and generates an adjusted value of MR4 based on the initial value of MR4 and the signal MR4_Shift. For example, the MR4_Shift signal may be a multi-bit signal which indicates how many steps the value of MR4 should be shifted from the initial value to generate the adjusted value. The value of MR4_Shift may be set based on different thresholds of how many addresses are stored in the queue 222. For example, if the queue 222 stores over a first number of addresses, MR4_shift may call for one shift, if the queue 222 stores over a second number of addresses, MR4_Shift may call for two shifts, and so forth. The MR4 adjustment circuit 214 writes the adjusted value of MR4 to the MR4 register 212.

The controller 250 performs mode register read (MRR) operations to read the value of MR4 from the MR4 register 212. For example, the controller 250 may periodically perform a MRR operation on the MR4 register 212 to retrieve the value of MR4 in the register 212. The refresh logic 252 provides the refresh signal REF with timing based on the most recent value of MR4 read from the memory 210. For example, the value of MR4 may determine a duration of a refresh interval. The refresh logic 252 provides the signal REF at least once per refresh interval. The refresh logic 252 may multiply a base refresh interval by the multiplier associated with the value of MR4. In some embodiments the base refresh interval may be a value stored in the memory (e.g., in a different register of the mode register).

Figure 3:
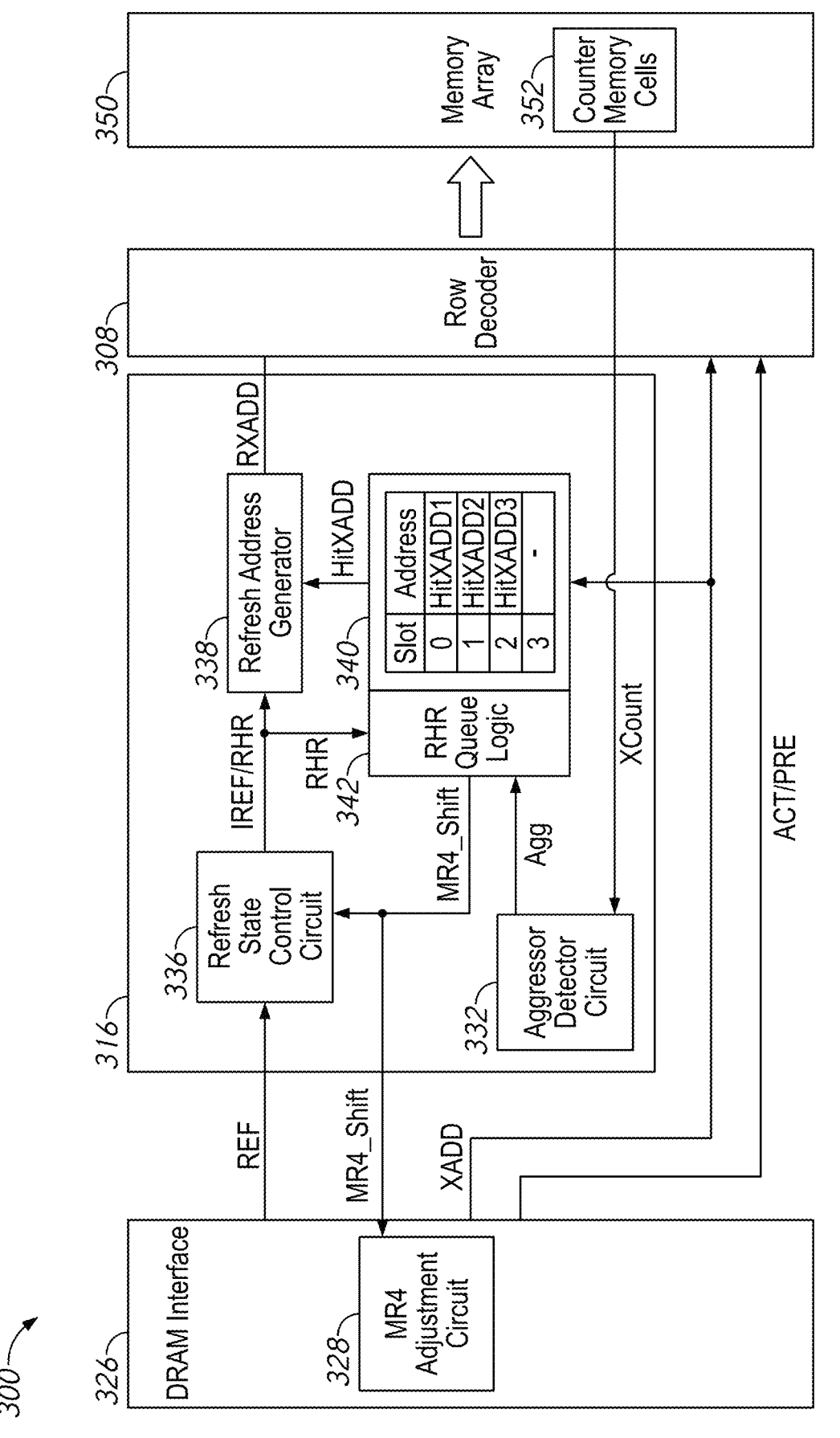
FIG. 3 is a block diagram of refresh circuits of a memory according to some embodiments of the present disclosure.

FIG. 3 is a block diagram of refresh circuits of a memory according to some embodiments of the present disclosure. The memory 300 may, in some embodiments, implement a portion of a memory device such as 100 of FIGS. 1 and/or 210 of FIG. 2. The memory 300 shows certain components and signals which are used in refresh operations. The memory 300 includes a refresh control circuit 316 (e.g., 116 of FIGS. 1 and/or 220 of FIG. 2), a row decoder 308 (e.g., 108 of FIG. 1), a memory array 350 (e.g., 118 of FIG. 1) and a DRAM interface 326, which represents other components of the memory, such as the command decoder (e.g., 106 of FIG. 1), mode register (e.g., 134 of FIG. 1), and address decoder (e.g., 104 of FIG. 1).

The refresh control circuit 316 includes a refresh state control circuit 336 which receives the refresh signal REF from the interface 326, and determines how many normal and targeted refresh operations should be performed by issuing internal refresh signal IREF and/or targeted refresh signal RHR. Responsive to IREF and/or RHR, a refresh address generator 338 of the refresh control circuit 316 provides a refresh address RXADD. The refresh control circuit 316 also includes an aggressor detector circuit 332 which determines if an accessed row address XADD is an aggressor or not, and a targeted refresh queue 340 (e.g., 132 of FIGS. 1 and/or 222 of FIG. 2) which stores the identified aggressor addresses. When the refresh state control circuit 336 calls for a targeted refresh operation, the refresh address generator 338 generates the refresh address RXADD based on an aggressor address HitXADD from the queue 340.

The DRAM interface 326 represents various components of the memory which send and receive signals and addresses to the refresh control circuit 316 and row decoder 350. The signals may be based on commands and/or addresses received from outside the memory (e.g., from a controller such as 250 of FIG. 2) and/or may be internally generated signals. As part of access operations, the DRAM interface 326 provides a row address XADD along with an activation signal ACT. Responsive to the signal ACT, the row decoder activates the word line of the memory array 350 associated with XADD. At the end of the access operation, the DRAM interface provides a pre-charge command PRE, and responsive to that the active word line is pre-charged. As part of refresh operations, the DRAM interface provides a refresh signal REF, which may be based on a refresh signal provided by a controller. Responsive to the refresh signal REF, the refresh control circuit 316 performs one or more refresh operations.

The refresh state control circuit 336 receives the refresh signal REF and generates one or more activations of an internal refresh signal IREF and/or a targeted refresh signal RHR. The number of times that IREF/RHR are activated, and in what combination, determines a sequence of refresh operations performed responsive to REF. In an example embodiment, if IREF is active, but not RHR, a normal refresh operation may be performed. If both IREF and RHR are active, then a targeted refresh operation may be performed.

The refresh state control circuit 336 may determine how many refresh operations to perform responsive to REF, and what distribution of normal and targeted refresh operations, based on internal logic. For example, responsive to REF, the refresh state control circuit may perform 3 refresh operations (e.g., three 'pumps' of the internal refresh signal IREF per REF). Two of those pumps may be targeted refresh operations and the third may be a normal refresh operation. In some embodiments, the refresh state control circuit may change its behavior responsive to the refresh rate shift signal MR4_Shift provided by the targeted refresh queue 340. For example, if the signal MR4_Shift calls for changing the MR4 register (e.g., compared to the value that would be used based on temperature alone) than the refresh state control circuit may increase the ratio of targeted:normal refresh operations. For example, the refresh state control circuit may call for 3 targeted refresh operations responsive to a first activation of REF and then 2 targeted refresh operations and one normal refresh operation responsive to a second activation of REF, and then repeat that pattern. An example of logic used by the refresh state control circuit based on the signal MR4_Shift is described in more detail in FIG. 5.

The refresh address generator circuit 338 provides a refresh address RXADD which indicates which word line or word lines should be refreshed as part of a refresh operation. As part of a normal refresh operation (e.g., when IREF but not RHR is active), sequence logic may be used to generate the refresh address. For example, the refresh address generator circuit 338 may include a counter circuit which generates a new normal refresh address based on a previous normal refresh address. The normal refresh address may be associated with multiple word lines, and responsive to the address RXADD and the refresh signal IREF, the row decoder 308 may refresh the word lines associated with RXADD.

As part of a targeted refresh operation (e.g., when both IREF and RHR are active), the refresh address generator 338 generates the refresh address RXADD based on an identified aggressor address HitXADD provided by the targeted refresh queue 340. The refresh address generator 338 may generate multiple refresh addresses based on a single aggressor address HitXADD. For example, the refresh address generator 338 may generate a first refresh address associated with a first word line adjacent to the word line associated with HitXADD and a second refresh address associated with a second word line adjacent to the word line associated with HitXADD. In some embodiments, other relationships may also be used. For example, every Nth targeted refresh operation, word lines further away than adjacent from the word line associated with HitXADD may be refreshed. In some embodiments, the refresh address RXADD generated as part of a targeted refresh operation may be associated with a single word line. Responsive to the refresh address RXADD and the refresh signal IREF, the word line associated with RXADD is refreshed by the row decoder 308.

The refresh control circuit 316 includes an aggressor detector circuit 332 which determines if a row address XADD should be added to the targeted refresh queue 340 or not (e.g., if the row address XADD is an aggressor address). When the current row address is determined to be an aggressor, the aggressor detector circuit provides an aggressor signal Agg. The aggressor detector circuit 332 may use various criteria to determine if the address is an aggressor. In some embodiments, random sampling may be used. In some embodiments, the aggressor detector circuit 332 may store addresses and count a number of times they are accessed. In some embodiments, an example of which is shown in FIG. 3 and described in more detail herein, per-row hammer tracking (PRHT) may be used. However, the present disclosure is not limited to the use of PRHT for tracking aggressor addresses.

In embodiments where PRHT is used, the memory array 350 includes a number of a counter memory cells which store a number of count values XCount each associated with a word line of the memory. For example, each word line may include a set of counter memory cells which store that word lines count value XCount as a binary number. When a word line is accessed, its count value XCount is read out to the aggressor detector circuit 332. The aggressor detector circuit 332 updates the count value XCount (e.g., by incrementing it) and compares the updated count to a threshold. If the count has not crossed the threshold, then the updated count value is written back to the counter memory cells 352. If the count has crossed the threshold (e.g., is equal to or greater than the threshold) then the aggressor detector circuit 332 provides an aggressor signal Agg, and resets the count value (e.g., to an initial value such as 0). In some embodiments, the threshold may be a maximum value of the count, and the count may cross the threshold when it 'rolls over' from a maximum value back to the initial value.

The targeted refresh queue 340 includes a register with a number of slots, each of which may store an address. The queue 340 may be made from a number of content addressable memory (CAM) cells, and may be referred to as a CAM in some embodiments. In the example of FIG. 3, four slots are shown, however more or fewer slots may be used in other example embodiments. A queue management logic circuit 342 may manage the addresses in the queue. Responsive to the signal Agg, the targeted refresh queue management logic circuit 342 stores the current row address XADD in an empty one of the slots. Responsive to the signal HitXADD, the queue management logic circuit 342 provides one of the stored addresses as HitXADD. After an address is removed from HitXADD, the queue management circuit 342 removes it from the queue (or marks the slot as used). In some embodiments, the queue management circuit 342 may manage the queue 340 as a FIFO queue. If the queue 340 becomes full, the queue management logic circuit may provide an alert signal, which may be provided external to the memory (e.g., to the controller).

The queue management circuit 342 provides a signal MR4_Shift which a value based on how many addresses are stored in the queue 340. The MR4 adjustment circuit 328 (e.g., 136 of FIGS. 1 and/or 214 of FIG. 2) changes a value of the MR4 register based on the signal MR4_Shift. In some embodiments, the signal MR4_Shift may be a multi-bit signal which indicates how many steps the value of MR4 should be shifted. The number of steps indicated my MR4_Shift may increase as the queue 340 holds more addresses (e.g., as it becomes closer to full). In some embodiments, the queue management logic circuit 342 may use thresholds to determine the value of MR4_Shift. In some embodiments, the threshold may be based on a number of addresses in the queue 340 and/or what percentage of 'full' the queue 340 is. For example, if the queue 340 is below a first threshold of fullness, then the signal MR4_Shift may call for no shifts, if the queue is at or above the first threshold then one shift may be called for, if the queue is at or above a second threshold then two shifts may be called for. An example of threshold logic is discussed in more detail in FIG. 4.

Figure 4:
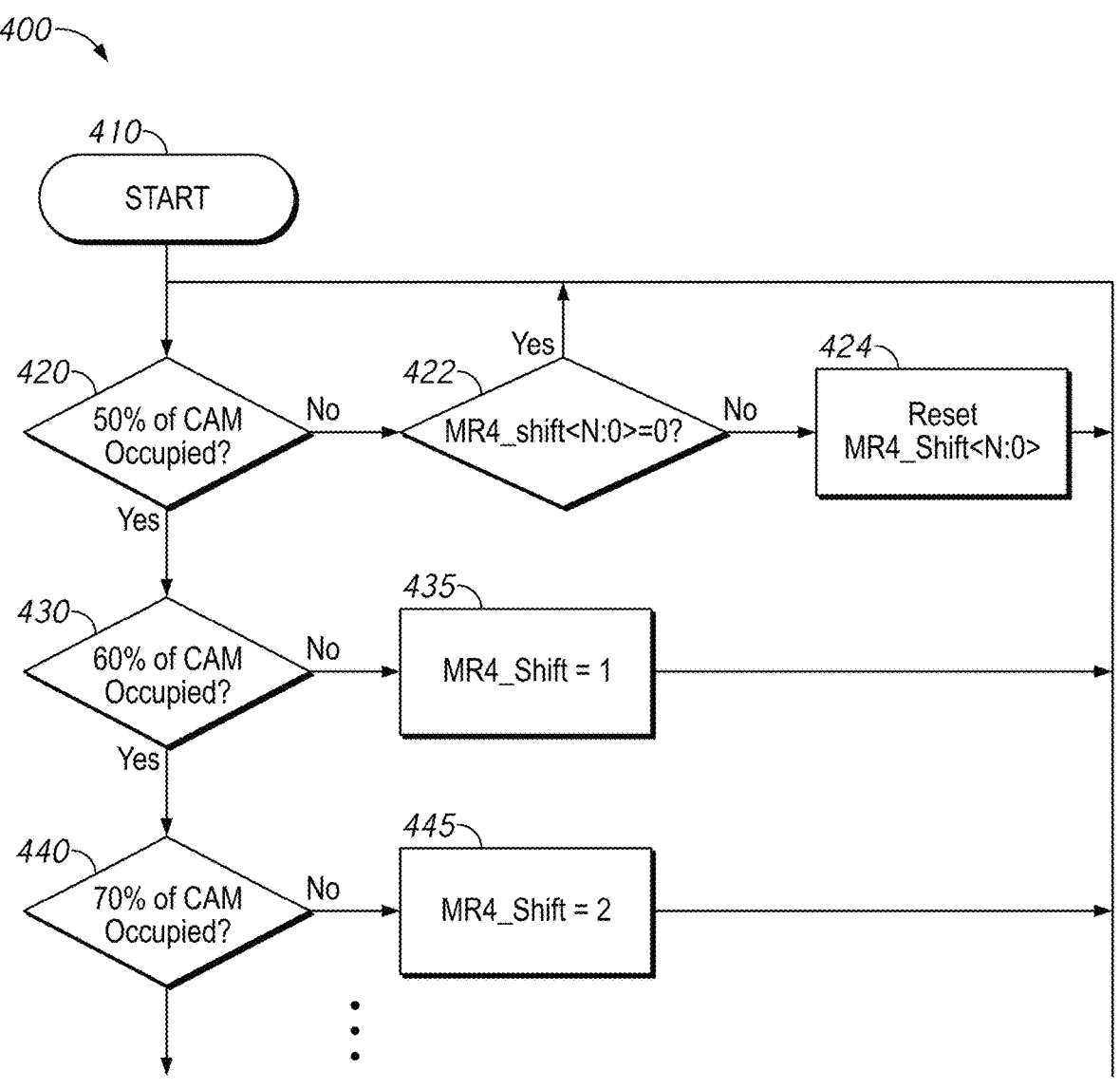
FIG. 4 is a flow chart of a method of setting a value of a refresh rate register shift signal according to some embodiments of the present disclosure.

FIG. 4 is a flow chart of a method of setting a value of a refresh rate register shift signal according to some embodiments of the present disclosure. For example the method 400 may be implemented by a targeted refresh queue circuit such as 132 of FIG. 1, 222 of FIG. 2, and/or 340 of FIG. 3. A queue management circuit (e.g., 342 of FIG. 3) of the refresh queue may monitor a status of the queue to implement the method 400.

The method 400 may begin with box 410 which describes a start of the method 400. The start may begin when the queue is modified, for example when an address is added to or removed from the queue (e.g., responsive to signals such as Agg or RHR). In other words, the steps of the method 400 may be repeated each time the queue is modified.

Box 410 is followed by box 420, which describes checking to see if at least 50% of the slots in the queue are occupied. If they are not, the method proceeds to box 422, which describes checking to see if the refresh register shift code MR4_Shift is at an initial value (e.g., if the signal MR4_Shift calls for no adjustment). If so, the method returns to the start 410. If not, the method 400 proceeds to block 424, which resets the value of MR4_Shift to the initial value and then returns to start 410. If at least 50% of the queue is full, then the method proceeds to block 430.

Block 430 describes checking to see if at least 60% of the slots of the queue are occupied. If not, the method proceeds to block 435, which sets the value of MR4_Shift to call for one adjustment step of the MR4 register (e.g., MR4_Shift=1). If the queue is at least 60% full, the method proceeds from block 430 to block 440.

Block 440 describes checking to see if at least 70% of the slots of the queue are occupied. If not the method proceeds to block 445, which describes setting the value of MR4_Shift to call for two adjustments steps of the MR4 register (e.g., MR4_Shift=2). If the queue is at least 70% full, the method 400 may proceed from block 440. Although only three thresholds are shown in FIG. 4, by using steps analogous to 430/435 and 440/445, additional thresholds and levels of adjustment may be specified. In some embodiments, the levels of the thresholds and/or the number of thresholds may be set based on a setting of the memory (e.g., in settings of the register).

Figure 5:
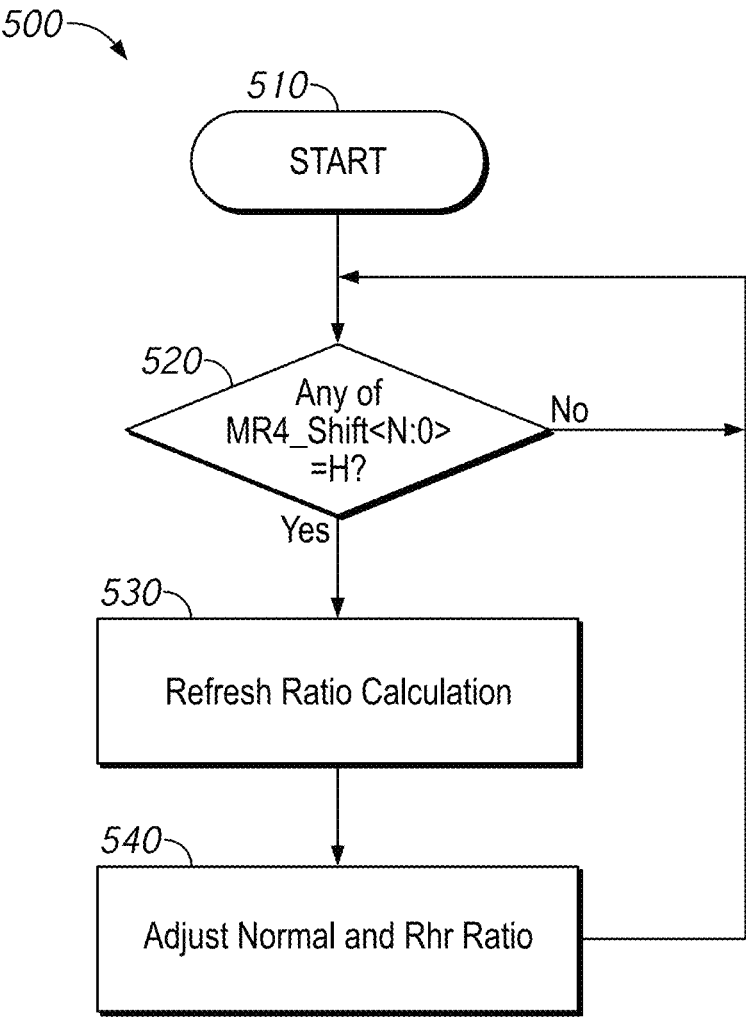
FIG. 5 is a flow chart of a method of adjusting a ratio of refresh operations according to some embodiments of the present disclosure.

FIG. 5 is a flow chart of a method of adjusting a ratio of refresh operations according to some embodiments of the present disclosure. The method 500 may, in some embodiments, be implemented by a refresh control circuit such as 116 of FIG. 1, 220 of FIG. 2, and/or 316 of FIG. 3. For example, the method 500 may be implemented by a refresh state control circuit such as 336 of FIG. 3.

The method 500 may begin with block 510, which describes starting the method. The method 500 may be performed each time a value of MR4_Shift changes (e.g., based on the method 400 of FIG. 4). After the start, block 510 is followed by block 520 which describes checking to see if the signal MR4_Shift calls for an adjustment of the MR4 register. For example, the method 500 may involve checking to see if any of the bits of MR4_Shift is a logical high. If not, the method may involve resetting a targeted to normal refresh ratio and returning to the start. If yes, then the method 500 may proceed to block 530.

Block 530 describes performing a refresh ratio calculation. For example, the method 500 may include determining a ratio of targeted to normal refresh operations based on the value of MR4_Shift. Block 530 is followed by block 540, which describes adjusting the ration of targeted to normal refresh operations based on the ratio determined in block 530.

FIG. 6 is a table of a values in a refresh rate register according to some embodiments of the present disclosure. The table 600 may, in some embodiments, represent the possible values which may be stored in a refresh rate register in a mode register, such as the mode register 134 of FIG. 1 and/or the MR4 register 212 of FIG. 2. The table shows a set of example values which may be stored in the register, as well as what refresh multiplier is called for.

In the example of FIG. 6, the value stored in the MR4 register may be a 5 bit number. At a minimum value (e.g., 00000) it may indicate that the memory is below a minimum operating temperature. At a maximum value (e.g., 11111), it may indicate that the memory is above a maximum operating temperature and/or that the combination of the temperature and the fullness of the targeted refresh queue have pushed the device outside of an operating range.

Figure 7:
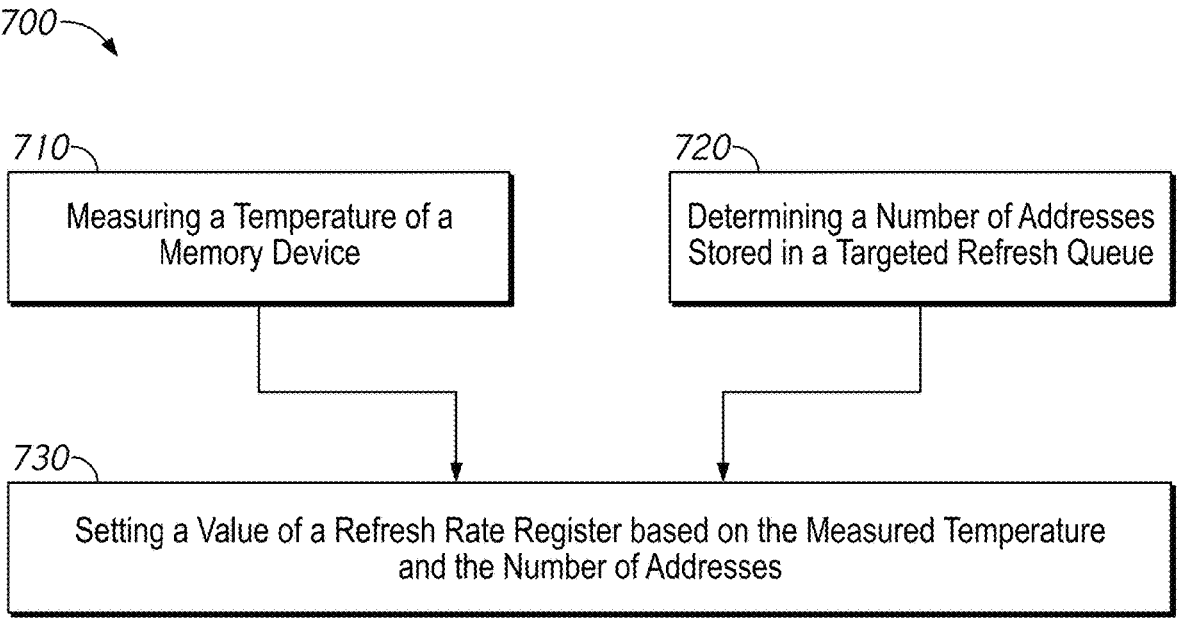
FIG. 7 is a flow chart of a method according to some embodiments of the present disclosure.

FIG. 7 is a flow chart of a method according to some embodiments of the present disclosure. The method 700 may, in some embodiments, be implemented by one or more apparatuses or systems described herein, such as the memory device 100 of FIG. 1, the memory system 200 of FIG. 2, and/or the memory device 300 of FIG. 3.

The method 700 includes block 710, which describes measuring a temperature of a memory device. A temperature sensor (e.g., 130 of FIGS. 1 and/or 216 of FIG. 2) measures a temperature of the device and provides a temperature code based on that measurement. In some embodiments, the temperature sensor may be positioned to measure a specific portion of the memory array, such as the memory array.

The method 7100 includes block 720, which describes determining a number of addresses stored in a targeted refresh queue. The targeted refresh queue (e.g., 132 of FIG. 1, 222 of FIGS. 2 and/or 340 of FIG. 3) may provide a refresh rate shift signal (e.g., MR4_Shift) with a value based on the number of addresses in the queue. For example, targeted refresh management logic circuit (e.g., 342 of FIG. 3) of the queue may monitor the queue and provide the signal.

The blocks 710 and 720 may represent ongoing processes that happen at the same time in the memory. The method 700 may include changing the temperature code when the measured temperature changes, and changing the refresh rate shift signal when the number of addresses in the queue changes (e.g., by performing the method 400 of FIG. 4).

Blocks 710 and 720 are followed by block 730, which describes setting a value of a refresh rate register based on the measured temperature and the number of addresses. For example, a refresh rate register adjustment circuit (e.g., 136 of FIG. 1, 214 of FIG. 2, and/or 328 of FIG. 3). The method 700 may include setting an initial value based on the measured temperature, adjusting the initial value a number of steps based on the number of addresses to generate an adjusted value, and writing the adjusted value to the refresh rate register.

The method 700 may include reading the value of the refresh rate register, for example by performing a mode register read operation on the refresh rate register. The method 700 may include providing a refresh signal with timing based on the value of the refresh rate register. For example, a controller (e.g., 250 of FIG. 2) may read the refresh rate value and then provide the refresh signal. The method 700 may include setting a refresh interval based on the refresh rate register and then providing the refresh signal at least once per refresh interval. In some embodiments, the method 700 may include multiplying a base refresh interval by a multiplier based on the refresh rate register.

The method 700 may include performing one or more refresh operations responsive to the refresh signal. The method may include performing normal refresh operations, targeted refresh operations, or a mix thereof responsive to the refresh signal. In some embodiments, the method 700 may include determining a ratio of normal and targeted refresh operation based on the number of addresses in the targeted refresh queue (e.g., based on the refresh rate shift signal).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a mode register comprising a refresh rate register;
a temperature sensor configured to provide a temperature code based on a measured temperature;
a targeted refresh queue configured to store a plurality of addresses, and configured to provide a refresh register shift signal with a value based on a number of the plurality of addresses; and
a refresh rate adjustment circuit configured to set a value of the refresh rate register based on the temperature code and the refresh register shift signal.

2. The apparatus of claim 1, wherein the refresh rate adjustment circuit is configured to select an initial value of the refresh rate register based on the temperature code and adjust the initial value a number of steps indicated by the refresh register shift signal to generate the value of the refresh rate register.

3. The apparatus of claim 1, wherein the targeted refresh queue is configured to provide the refresh register shift signal with a first value if it is below a first threshold, a second value if it is between the first threshold and a second threshold and a third value if it is above the second threshold.

4. The apparatus of claim 1, further comprising an aggressor detector circuit configured to provide an aggressor signal if a row address is determined to be an aggressor address, wherein responsive to the aggressor signal the targeted refresh queue is configured to store the row address as one of the plurality of addresses.

5. The apparatus of claim 1, further comprising:
a refresh state control circuit configured to perform one or more refresh operations responsive to a refresh signal, wherein the one or more refresh operations are normal refresh operations or targeted refresh operations; and
an address generator circuit configured to generate at least one refresh address based on a selected one of the stored plurality of addresses in the targeted refresh queue as part of the targeted refresh operation.

6. The apparatus of claim 5, wherein the refresh state control circuit is configured to change a ratio of the normal refresh operations and the targeted refresh operations based on the value of the refresh register shift signal.

7. The apparatus of claim 5, wherein responsive to the targeted refresh operation the targeted refresh queue is configured to provide the selected one of the plurality of addresses and remove it from the targeted refresh queue.

8. A system comprising:
a memory comprising:
a mode register comprising a refresh rate register;
a temperature sensor configured to measure a temperature of the memory;
a refresh control circuit configured to perform at least one refresh operation responsive to a refresh signal, wherein the refresh control circuit includes a targeted refresh queue configured to store addresses; and
a refresh rate adjustment circuit configured to set a value of the refresh rate register based on the measured temperature and a number of addresses stored in the targeted refresh queue; and
a controller configured to provide the refresh signal at a rate based the value of the refresh rate register.

9. The system of claim 8, wherein the controller includes a refresh logic circuit configured to set a refresh interval based, in part, on the value of the refresh rate register and provide the refresh signal at least once in each of the refresh intervals.

10. The system of claim 9, wherein the value of the refresh rate register indicates a refresh multiplier and wherein and refresh logic multiplies a base refresh interval by the refresh multiplier.

11. The system of claim 8, wherein the refresh control circuit is configured to perform targeted refresh operations or normal refresh operations as the at least one refresh operation, and wherein the refresh control circuit is configured to set a ratio of the targeted and the normal refresh operations based on the number of addresses stored in the targeted refresh queue.

12. The system of claim 8, wherein the refresh rate adjustment circuit is configured to set an initial value based on the temperature and adjust the initial value a number of steps based on the number of addresses.

13. The system of claim 8, wherein the refresh control circuit includes an aggressor detector circuit configured to identify the addresses to store in the targeted refresh queue.

14. A method comprising:
measuring a temperature of a memory device;
determining a number of addresses stored in a targeted refresh queue;
setting a value of a refresh rate register based on the measured temperature and the number of addresses.

15. The method of claim 14, further comprising:
reading the value of the refresh rate register; and
providing a refresh signal with timing based on the value of the refresh rate register.

16. The method of claim 15, further comprising performing one or more refresh operations responsive to the refresh signal.

17. The method of claim 14, further comprising determining a ratio of normal and targeted refresh operations based on the number of addresses stored in the targeted refresh queue.

18. The method of claim 14, further comprising:
determining if an address is an aggressor address; and
adding the aggressor address to the targeted refresh queue.

19. The method of claim 14, further comprising:
setting an initial value of the refresh rate register based on the measured temperature;
adjusting the initial value by a number of steps based on the number of addresses to generate an adjusted value; and
setting the adjusted value as the value of the refresh rate register.

20. The method of claim 19, further comprising:
comparing the number of addresses to a number of thresholds; and
setting the number of steps based on the comparing.

* * * * *